US012754373B2

(12) United States Patent
Rushford et al.

(10) Patent No.: US 12,754,373 B2
(45) Date of Patent: Oct. 6, 2026

(54) TWISTER OVEN FOR PHOTOCONDUCTIVE SWITCHES

(71) Applicant: Lawrence Livermore National Security, LLC, Livermore, CA (US)

(72) Inventors: Michael Rushford, Livermore, CA (US); Lars F. Voss, Livermore, CA (US); Caitlin Anne Chapin, Fremont, CA (US); Joseph Devin Schneider, Danville, CA (US); Victor Khitrov, San Ramon, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 569 days.

(21) Appl. No.: 18/184,033

(22) Filed: Mar. 15, 2023

(65) Prior Publication Data

US 2024/0310580 A1 Sep. 19, 2024

(51) Int. Cl.

*G02B 6/26* (2006.01)
*G02B 6/42* (2006.01)
*H03K 17/78* (2006.01)

(52) U.S. Cl.

CPC ........... *G02B 6/262* (2013.01); *G02B 6/4295* (2013.01); *H03K 17/78* (2013.01)

(58) Field of Classification Search

CPC ....... G02B 6/262; G02B 6/4295; H03K 17/78
See application file for complete search history.

(56) References Cited

U.S. PATENT DOCUMENTS

| | | | | |
|---|---|---|---|---|
| 3,389,950 | A | 6/1968 | Harper | |
| 3,921,705 | A | 11/1975 | Furuse et al. | |
| 4,611,885 | A | 9/1986 | Boirat | |
| 6,856,728 | B2 * | 2/2005 | Zhang .................. | G02B 6/4214 385/119 |

(Continued)

FOREIGN PATENT DOCUMENTS

| | | | |
|---|---|---|---|
| DE | 102017116477 | A1 | 1/2019 |
| FR | 2639472 | A1 | 5/1990 |

OTHER PUBLICATIONS

Xu, Miaomiao, et al., "Methods of optimizing and evaluating geometrical lightguides with micro structure mirrors for augmented reality displays," Optics Express vol. 27, No. 4, 2019.

*Primary Examiner* — Tina Wong
(74) *Attorney, Agent, or Firm* — Perkins Coie LLP

(57) ABSTRACT

Devices, systems, and methods for illuminating a photoconductive switch are disclosed. The disclosed technology minimizes an amount of light that is reflected back into an input optical waveguide. The disclosed technology provides an illumination oven that delivers light from the input optical waveguide to the photoconductive switch. The illumination oven is configured to trap light and cause multiple reflection passes of the light therewithin. The illumination oven is configured to reduce opportunities for the light to escape via the input optical waveguide. In particular, the illumination oven includes a tipped or angled top end that directs light downward to the photoconductive switch. The input optical waveguide is coupled to the illumination oven at a lateral offset, which, along with the tipped top end, causes the light to rattle and chaotically flow within the illumination oven to be ultimately absorbed by the photoconductive switch or dissipate.

22 Claims, 12 Drawing Sheets

(56) References Cited

U.S. PATENT DOCUMENTS

| | | | |
|---|---|---|---|
| 8,238,042 | B2 | 8/2012 | Dewitt et al. |
| 8,858,542 | B2 * | 10/2014 | Peng ...................... A61B 18/24 606/16 |
| 9,323,005 | B1 * | 4/2016 | Griffin .............. C03B 37/01211 |
| 9,662,713 | B2 * | 5/2017 | Young ................. B23B 31/1238 |
| 9,864,140 | B2 * | 1/2018 | Adler ................. G02B 27/0911 |
| 10,530,362 | B2 | 1/2020 | Voss et al. |
| 11,555,965 | B1 | 1/2023 | Rushford et al. |
| 2006/0256449 | A1 * | 11/2006 | Cianciotto ......... G02B 27/0927 359/726 |
| 2010/0309566 | A1 * | 12/2010 | DeWitt ................ G02B 17/084 359/729 |
| 2012/0210797 | A1 * | 8/2012 | Yu ........................ G02B 6/4214 264/1.27 |
| 2017/0235055 | A1 * | 8/2017 | Fujita ................. G02B 27/0994 385/24 |

* cited by examiner

TWISTER OVEN FOR PHOTOCONDUCTIVE SWITCHES

STATEMENT REGARDING FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

This patent document relates to methods and device that improve efficiency and operation of optical and/or photonic devices, such as photoconductive switches.

BACKGROUND

Optical and/or photonic devices, such as photoconductive switches, are operated and controlled using light. For example, irradiance of light on a photoconductive switch triggers changes in the switch's electrical conductance, and thus, external light is controllably illuminated on the photoconductive switch to operate the switch. To improve the operation of the photoconductive device, it is important to efficiently deliver the incident light to the photoconductive device.

SUMMARY

Embodiments of the disclosed technology relate to methods and devices that improve the efficiency of light delivery to a photoconductive device that is achieved in-part by reducing and/or minimizing an amount of incident light that is reflected back into an input optical fiber or other light source, while producing a substantially uniform illumination on the photoconductive device. Among other features and benefits, the disclosed embodiments increase the amount of incident light that is absorbed and/or delivered to the optical and/or photonic device and increase an overall input-output efficiency. According to example embodiments, an illumination oven device delivers light received from an input optical waveguide to a photoconductive switch, and the illumination oven device encourages twisting and chaotic flow of the light to lessen opportunities by the light to return to the input optical waveguide (e.g., optical fiber). In particular, most light reflected back by a reflective surface of the photoconductive device makes multiple reflective passes within the illumination oven device—rather than exiting through the input optical waveguide—to ultimately dissipate or be absorbed by the photoconductive device on another attempt. Thus, the illumination oven device encourages laser light absorption in a photo conductor material and minimizes losses at reflective surfaces. Example embodiments also include tapered optical waveguides that are configured to further encourage the twisting and trapping of light in the illumination oven device.

Accordingly, the disclosed embodiments include devices, systems, and methods for illuminating a photoconductive (or semiconductor) switch and improving the efficiency thereof. In an example aspect, an illumination oven device for delivering illumination to a photoconductive switch is provided. The illumination oven device includes a cylindrical body that includes a top end and a bottom end. The bottom end is configured to interface with and deliver light to the photoconductive device. The top end is angled relative to the bottom end. The illumination oven device further includes a port located on a sidewall of the cylindrical body to allow input light from an illumination source to enter the cylindrical body. The port is configured to allow the input light that enters the cylindrical body to be incident on and reflected downward from a surface of the top end, and wherein at least a portion of the input light that enters the cylindrical body undergoes multiple reflections from internal surfaces of the cylindrical body prior to being directed to the photoconductive device through the bottom end.

DETAILED DESCRIPTION

In the description that follows, a photoconductive switch is referenced as an example photoconductive device in order to facilitate the understanding of the disclosed technology. It is however understood that the various embodiments disclosed herein are applicable to light delivery to various photonic and optical devices, including various photoinductive devices that can benefit from efficient delivery of light to the photonic/photoconductive material.

A photoconductive switch (also referred to as a semiconductor switch) is comprised of a photoconductive material (e.g., a wide bandgap semiconductor such as SiC, GaN, GaAs or diamond), electrodes that are typically positioned on the top and the bottom of the photoconductive material for applying a voltage and collecting current, and a light source of appropriate energy and wavelength to optically generate current. Light can be coupled to the photoconductive material in different configurations, such as from side (or lateral) or top/bottom (axial) positions. In some configurations, light from the light source is incident on the top electrode (typically via a waveguide such as an optical fiber), enters the photoconductive material (e.g., through transparent electrode, one or more transparent windows, and the like), and generates free carriers in the photoconductive material, which then contributes to the conductivity of the semiconductor switch. Some amount of the light delivered to the photoconductive switch is reflected, and loss of the reflected light back into an input optical waveguide reduces the efficiency of the photoconductive switch.

Embodiments of the disclosed technology include devices, systems, and methods that make efficient use of the incident light by trapping reflected light so that the reflected light can be ultimately absorbed by the photoconductive switch. In particular, example embodiments include an oven with reflective surfaces configured to encourage multiple reflection passes of light onto the photoconductive switch and to minimize an escape of reflected light. Thus, the disclosed technology reduces light loss and increases an amount of light absorbed by a photoconductive material. In some embodiments, the disclosed technology improves a response of a photoconductive switch to light input, with the photoconductive switch having a larger voltage drop when light is delivered using an illumination oven as described herein.

Figure 1A:
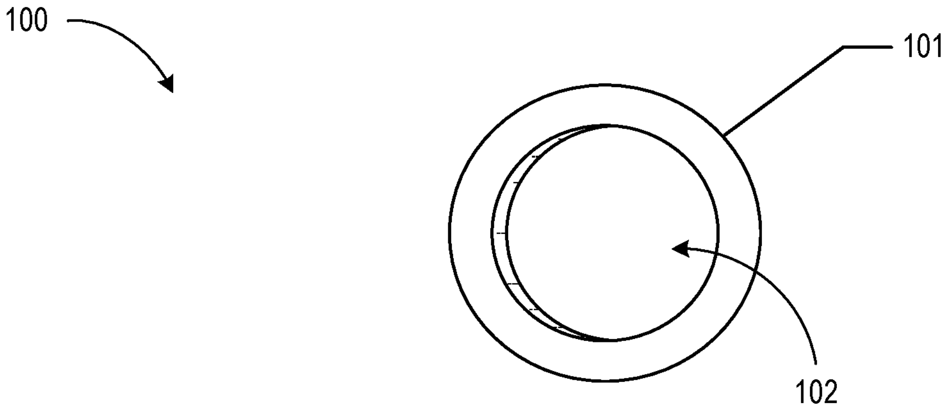
FIGS. 1A-1C illustrate various views of an example of an illumination oven device, in accordance with embodiments of the disclosed technology.
Figure 1B:
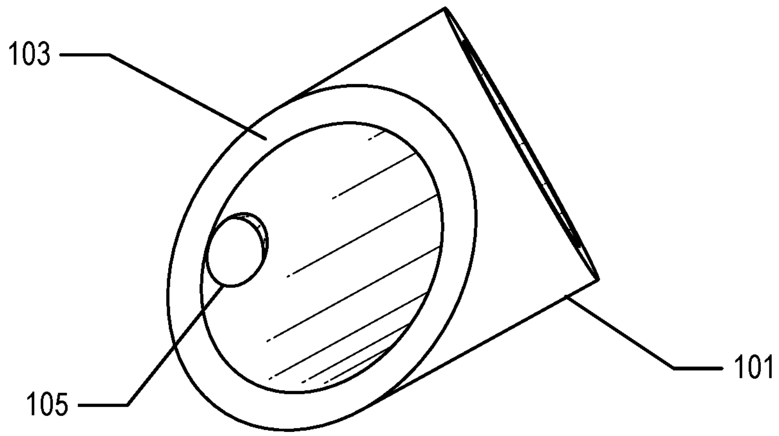
Figure 1C:
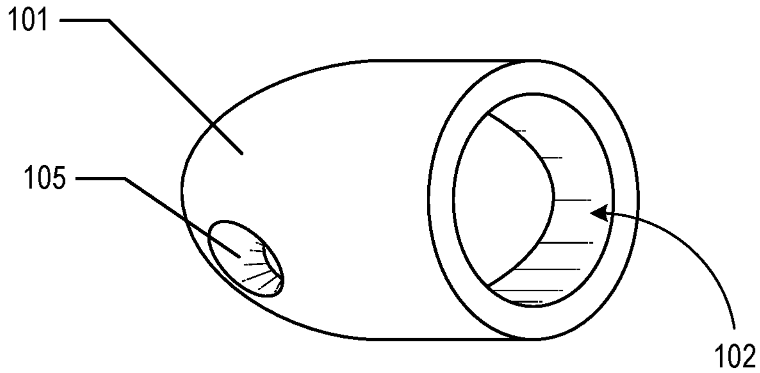

FIGS. 1A-1C illustrate various views of sections of an illumination oven device 100, according to some example embodiments. The illumination oven device 100 is composed of a metal material (e.g., aluminum, silver, stainless steel, sterling steel, other reflective metals) with reflective surfaces such that the illumination oven device 100 can deliver light to a photoconductive switch to which the illumination oven device 100 is coupled or attached. The illumination oven device 100 also includes a top reflective surface that is further described in connection with FIG. 3.

As shown, the illumination oven device 100 includes a cylindrical body 101, and the cylindrical body 101 includes a bottom end 102 and a top end 103. For delivery of light or illumination to a photoconductive switch, the illumination oven device 100 can be positioned such that the cylindrical body 101 stands upright on a surface of the photoconductive switch for receiving the light or illumination. Accordingly, the bottom end 102 of the cylindrical body 101 of the illumination oven device 100 interfaces with the photoconductive switch, and light is delivered by the illumination oven device 100 through or out of the bottom end 102 of the cylindrical body 101. In some embodiments, the illumination oven device 100 is attached to the photoconductive switch at the bottom end 102, and optical adhesive materials can be used to secure or fixedly attach the bottom end 102 to a surface of the photoconductive switch.

In the illustrated embodiment, the cylindrical body 101 is hollow; that is, the cylindrical body 101 includes a cavity therewithin. As illustrated, the cylindrical body 101 includes a cylindrical sidewall that encloses and defines a cavity. In some embodiments, the cylindrical body 101 defines an open cavity at least at the bottom end 102, with the bottom end 102 including a bottom opening continuous with the open cavity. Thus, the cavity of the cylindrical body 101 opens to a bottom opening at the bottom end 102 of the cylindrical body 101 that allows the light received in the cavity to be directed out of the bottom opening at the bottom end 102. An internal surface of the cylindrical body 101 is reflective, to facilitate the receiving and directing of light in the cavity and out of the bottom opening of the bottom end 102.

According to the disclosed technology, the top end 103 is tipped or angled with respect to the bottom end 102. In particular, the top end 103 is tipped such that the top end 103 is not parallel with the bottom end 102. As illustrated, due to the tipping or angling of the top end 103, a height of the cylindrical body 101 (or a distance between the top end 103 and the bottom end 102) is not the same along a circumference of the cylindrical body 101. Accordingly, the top end 103 spans between a maximum height of the cylindrical body 101 and an intermediate height of the cylindrical body 101. Based on the tipping or angling of the top end 103, light incident on the top end 103 (and in particular, an interior surface, face, or aspect of the top end 103) can be reflected downwards towards the bottom end 102, where the light can exit the illumination oven device through the bottom end 102 (and/or a bottom opening at the bottom end 102).

The example illumination oven device 100 further includes a side port 105 in the cylindrical body 101, and the illumination oven device 100 is configured to receive light via the side port 105 and to allow the received light to be multiply reflected within the oven (including from a top surface—see FIG. 3) before exiting the bottom end 102. The side port 105 is located in, at, or on a sidewall of the cylindrical body 101. For example, the side port 105 can be located opposite of an angled top surface of the oven such that at least a portion of light entering the oven via the side port 105 is reflected by the angled top surface of the oven.

In the illustrated embodiment in which the cylindrical body 101 is hollow, the side port 105 spans through a sidewall of the cylindrical body 101. Accordingly, light delivered through the side port 105 travels into the cavity, where the light can be reflected by the reflective surfaces defining the cavity.

As discussed throughout this document and further below, the position and/or height of the side port 105 and the tipping of the top end 103 cause light to be chaotically twisted and reflected multiple times within the illumination oven device 100 and minimize an opportunity for the light to exit through the side port 105 after entering the illumination oven device 100.

Figure 2:
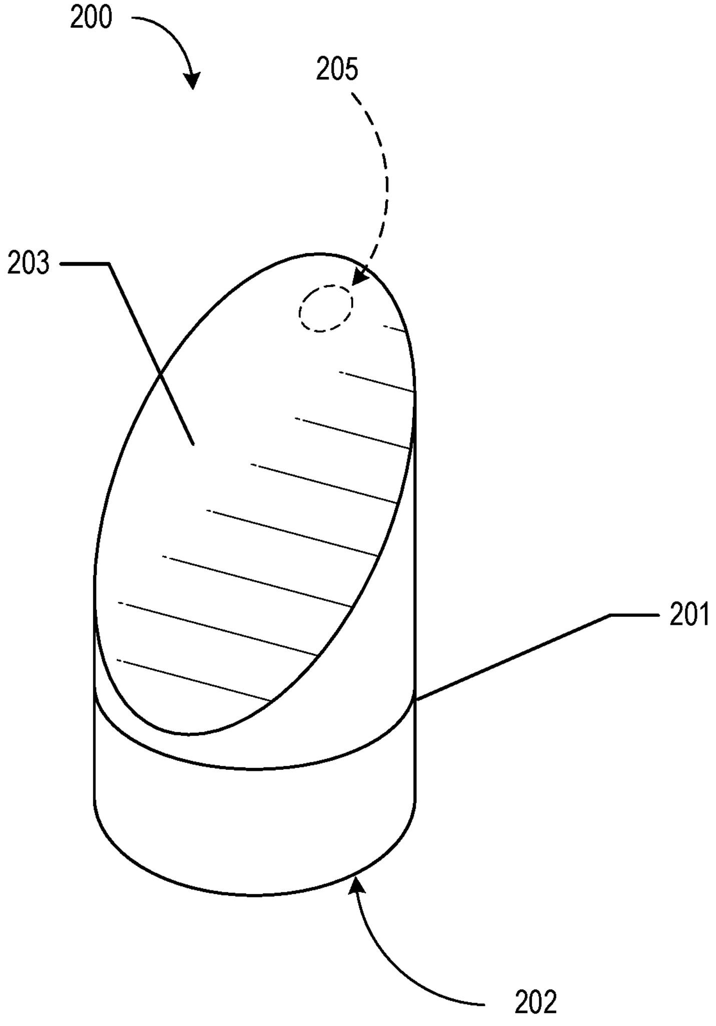
FIG. 2 illustrates an example of an illumination oven device, in accordance with embodiments of the disclosed technology.

FIG. 2 illustrates another example of an illumination oven device 200. The illumination oven device 200 includes a cylindrical body 201 with a bottom end 202 and a top end 203 that is tipped or angled with respect to the bottom end 202. The illumination oven device 200 is illustrated in an upright position, and the illumination oven device 200 can be disposed in the upright position atop a photoconductive switch such that the bottom end 202 interfaces with the photoconductive switch. The illumination oven device 200 includes a side port 205 located on or in the cylindrical body 201, and the illumination oven device 200 is configured to receive light via the side port 205 and deliver the light through the bottom end 202 to a photoconductive switch.

In particular, the illumination oven device 200 includes a solid construction; for example, the cylindrical body 201 is a solid body without a cavity defined therein. Accordingly, light received by the illumination oven device 200 travels through the solid material composing the cylindrical body 201, and the solid material composing the cylindrical body 201 is transparent or facilitates the propagation of light. For example, the cylindrical body 201 is constructed of silica glass or other material (e.g., silicate glass, other silica- or silicate-based glasses, doped glasses, fluoride glasses, and/or the like) that facilitates the transmission of light.

The cylindrical body 201 confines light within the solid glass material thereof based on the cylindrical body 201 being coated in reflective material. Thus, light propagating through the cylindrical body 201 can be reflected by reflective coating disposed on an outer surface of the cylindrical body 201 and a surface of the top end 203. In an alternate configuration, the top end 203 may be made reflective by inclusion of an additional reflective surface (e.g., a flat mirror), as, for example, described in connection with FIG. 3. In some embodiments, the cylindrical body 201 and/or the top end 203 surface can be coated in silver, silver nitrate, aluminum, and/or the like, and the coating of the cylindrical body 201 is performed using a bath. According to the disclosed technology, the use of reflective coating or material disposed on the surfaces of the cylindrical body 201 improves the intended light trapping of the illumination oven device over simply relying upon total internal reflection (TIR) without the reflective coating or material. For example, given that an objective of the illumination oven device being chaotically trapping light over multiple reflection passes within the cylindrical body 201, it is likely that light can be incident upon the surface of the cylindrical body 201 at non-TIR angles and can therefore, without such reflective coating, exit the cylindrical body 201 at the surfaces of the cylindrical body 201.

In some embodiments, an illumination oven device can be coated in additional material to promote robustness and/or to provide an electrode. For example, the illumination oven device 200 can be further coated with epoxy and/or nickel electroplating atop the reflective material for protection against oxidation, relief against strain, and electrode functionality. In some examples, a protection coating of an illumination oven device includes an organic epoxy material. This additional coating can be applied to non-solid and hollow illumination oven devices as well, including the illumination oven device 100.

Figure 3:
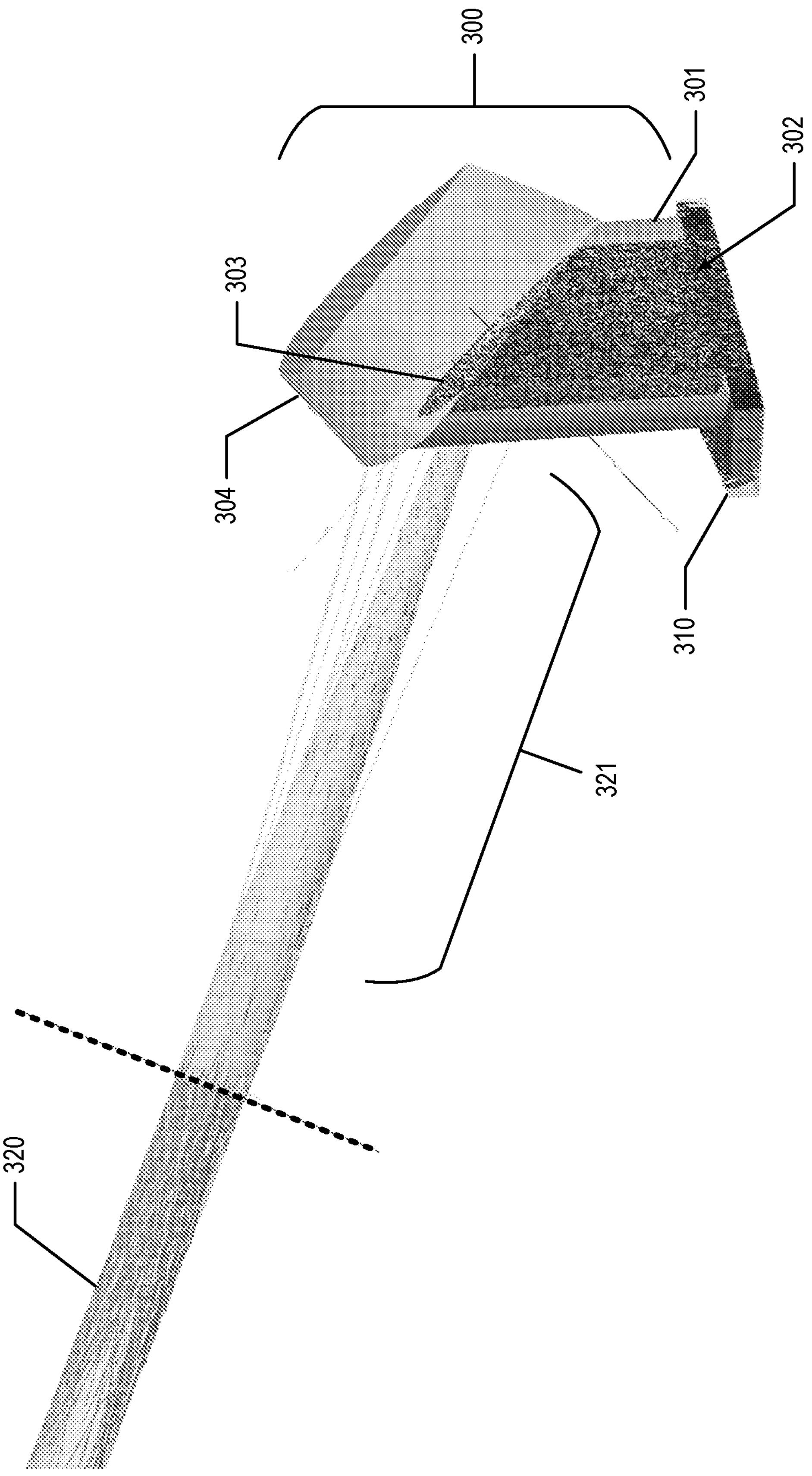
FIG. 3 illustrates an example of an illumination system that includes an illumination oven device that channels light from an optical waveguide to a photoconductive device, in accordance with embodiments of the disclosed technology.

FIG. 3 illustrates an example illumination system for delivering illumination to a photoconductive switch. FIG. 3 shows an illumination oven device 300 coupled to the photoconductive switch 310 and receiving an optical fiber 320, and the illumination oven device 300 is configured to deliver light emitted by the optical fiber 320 to the photoconductive switch 310.

In particular, the illumination oven device 300 includes a cylindrical body 301 within a bottom end 302 and a top end 303. For example, the illumination oven device 300 is a cylindrical oven. As discussed, the bottom end 302 is coupled and/or attached to the photoconductive device, and the top end 303 is tipped or skewed to reflect light incident thereon towards the bottom end 302 and the photoconductive switch 310.

The illumination oven device 300 includes a mirror 304 disposed atop the top end 303 of the cylindrical body. For example, the mirror 304 is coupled and/or fixedly attached (e.g., using optical adhesives) to the top end 303 of the cylindrical body 301. In the illustrated configuration, light received via a side port of the illumination oven device 300 is reflected from the surface of the mirror and is directed into the cavity of the illumination oven device 300. In some embodiments, the mirror 304 is configured with a higher reflectance than that of the cylindrical body 301 (or the reflective surfaces thereof). In some embodiments, the mirror 304 has approximately the same reflectance as the reflective surfaces of the cylindrical body 301. For example, the mirror 304 is composed of the same material as the cylindrical body 301. In some embodiments, for a hollow cylindrical body, the top end 303 is closed and does not include a top opening, and the top end 303 itself functions as the mirror 304.

As discussed above, the illumination oven device 300 can receive light via a side port (not explicitly shown in FIG. 3) in accordance with example embodiments disclosed herein, and in some embodiments, the incident light is delivered by the optical fiber 320, which is coupled, connected, and/or attached to the side port. FIG. 3 demonstrates an example configuration that minimizes back reflected light from propagating back into the optical fiber 320. In FIG. 3, a ray tracing model is used where simulated light rays originating at the dotted line travel down the optical fiber 320 to reach the illumination oven device 300 (e.g., into a cavity thereof, into a solid material composing the cylindrical body 301); the illumination oven device 300 traps the light rays for absorption by the photoconductive switch 310. Only a relatively small amount of the light rays is back reflected into the optical fiber 320, for example demonstrated by reflected light rays to the left of the dotted line. In contrast, a maximized amount of the light rays is either absorbed directly by the photoconductive switch 310 or rattle around within the illumination oven device 300 to ultimately dissipate or be finally absorbed by the photoconductive switch 310 in another pass. In some embodiments, less than a 5% percent, or between 1% percent and 5% percent, of the light emitted into the illumination oven device 300 is back reflected into the optical fiber 320. This provides an improvement over prior systems where significantly more light could be back reflected into the fiber or delivery waveguide.

In some embodiments, the optical fiber or waveguide is shaped to include a tapered end 321 that further contributes to the trapping of light within the illumination oven device 300. In particular, the tapered end 321 of the optical fiber 320 increases an angular spread of the light when emitted inside the illumination oven device 300. As such, the tapered end 321 encourages chaotic trapping of the light within the illumination oven device 300, with the light being dispersed and making multiple reflection passes. In some embodiments, the tapered end 321 homogenizes the light entering the illumination oven device 300 and also terminates in a smaller opening that can reduce an amount of back reflected light that re-enters the optical fiber 320. In some embodiments, the tapered end 321 terminates in a small anti-taper. By way of the tapered end 321, an opening by which light in the oven can find its way back into the fiber is minimized.

In some embodiments, the optical fiber 320 (or the tapered end 321 thereof) is fixedly attached to the illumination oven device 300. For example, optical adhesives are used to secure the tapered end 321 of the optical fiber 320 within a side port of the illumination oven device 300. The free end of the optical fiber 320 (i.e., the end not provided to the side port) can then be coupled to a light source or another optical fiber that delivers the input light from the light source. In some embodiments, the illumination system includes a protection coating that is continuously disposed on an outer surface of the illumination oven device 300 and at least the tapered end 321 of the optical fiber 320. The tapered end 321 of the optical fiber 320 can be securely coupled and attached to the illumination oven device 300 (in a side port thereof) at least in part due to the continuous protection coating. In some embodiments, the tapered end 321 of the optical fiber 320 is connected to the illumination oven device 300 (e.g., positioned within a side port thereof), and the illumination oven device 300 with the tapered end 321 of the optical fiber 320 is bathed in a protection coating material (e.g., organic epoxy).

Reference is made herein to optical fibers for ease of description, and it is understood that concepts related thereto are similarly applicable to generally optical waveguides. For example, the illumination system includes an optical waveguide configured to deliver light to the illumination oven device (which in turn delivers the light to the photoconductive switch), and the optical waveguide can include a tapered end.

FIGS. 4A-4D illustrate various views of an illumination system that includes an illumination oven device 400 and an optical fiber 420 coupled thereto. The illumination oven device 400 includes a cylindrical body 401 that is hollow, and the cylindrical body 401 includes a bottom end 402 and a top end 403. The bottom end 402 is open for light trapped within the illumination oven device 400 to exit and be absorbed by a photoconductive device located at the bottom end 402, and the top end 403 is enclosed by a mirror 404. As noted earlier, in some embodiments, similar functionality can be achieved using a configuration in which the top end 403 is closed and is configured as a reflecting surface.

Figure 4A:
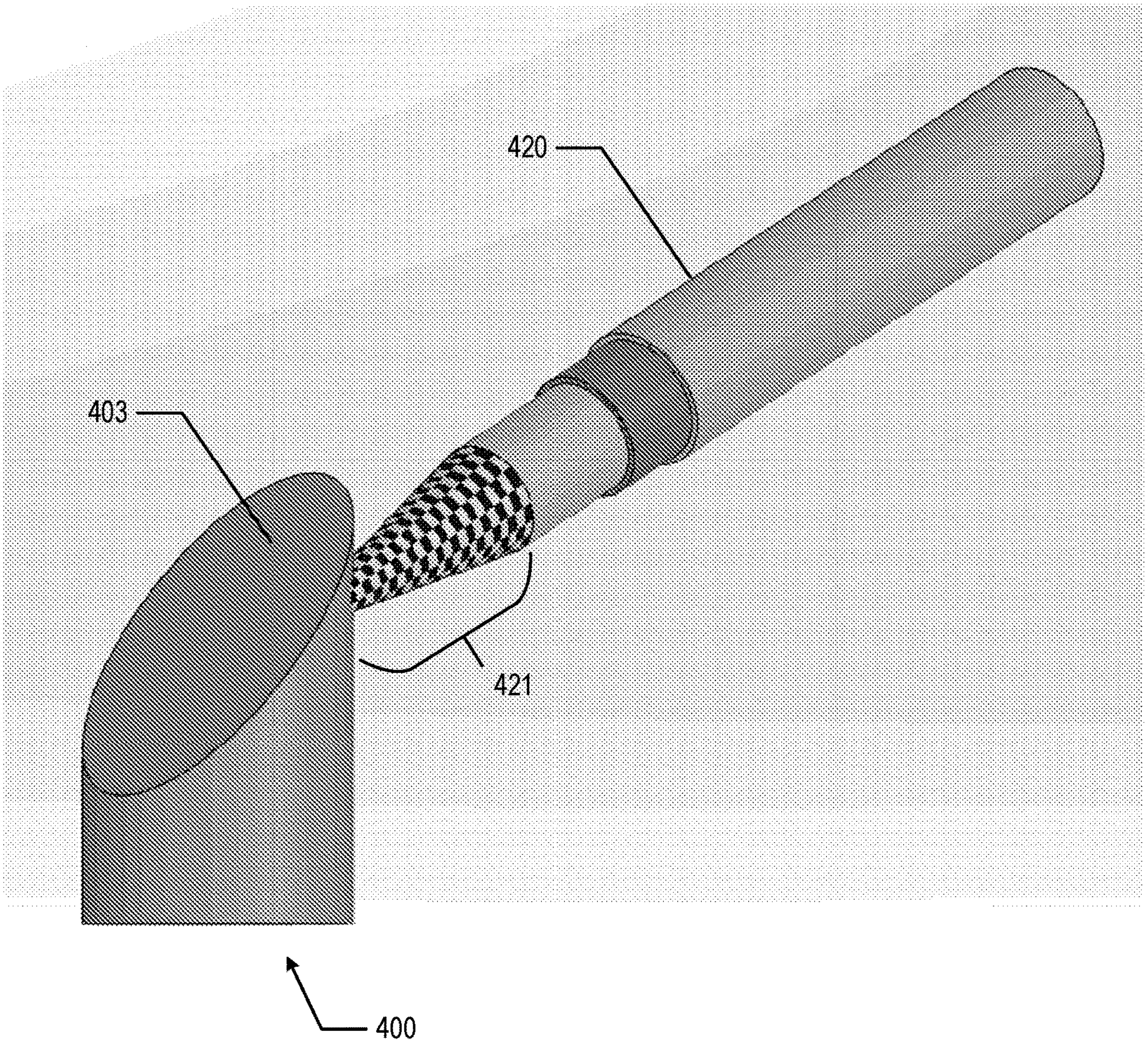
FIGS. 4A-4D illustrate various views of an example of an illumination oven device with which a tapered optical waveguide is coupled, in accordance with embodiments of the disclosed technology.
Figure 4B:
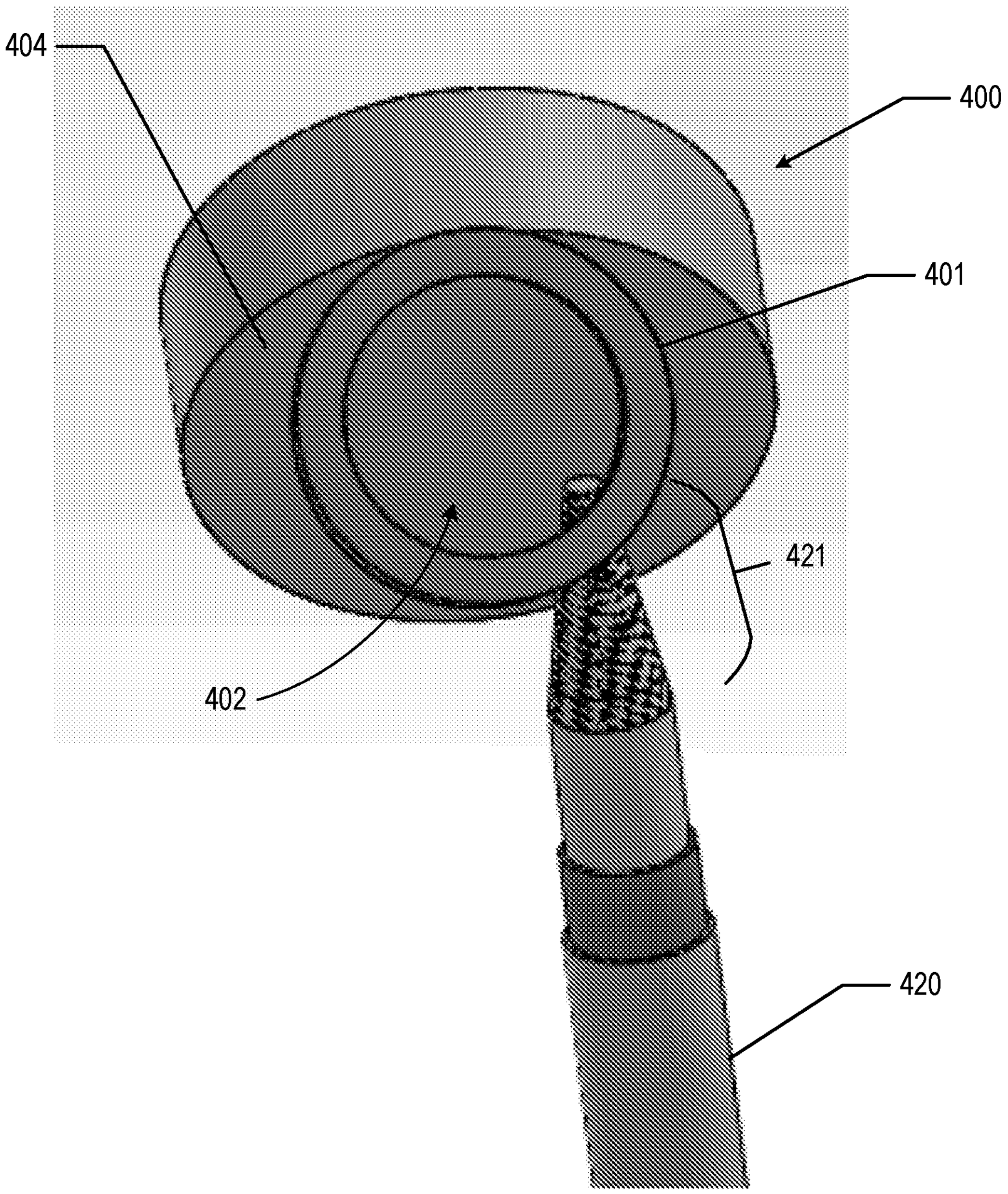
Figure 4C:
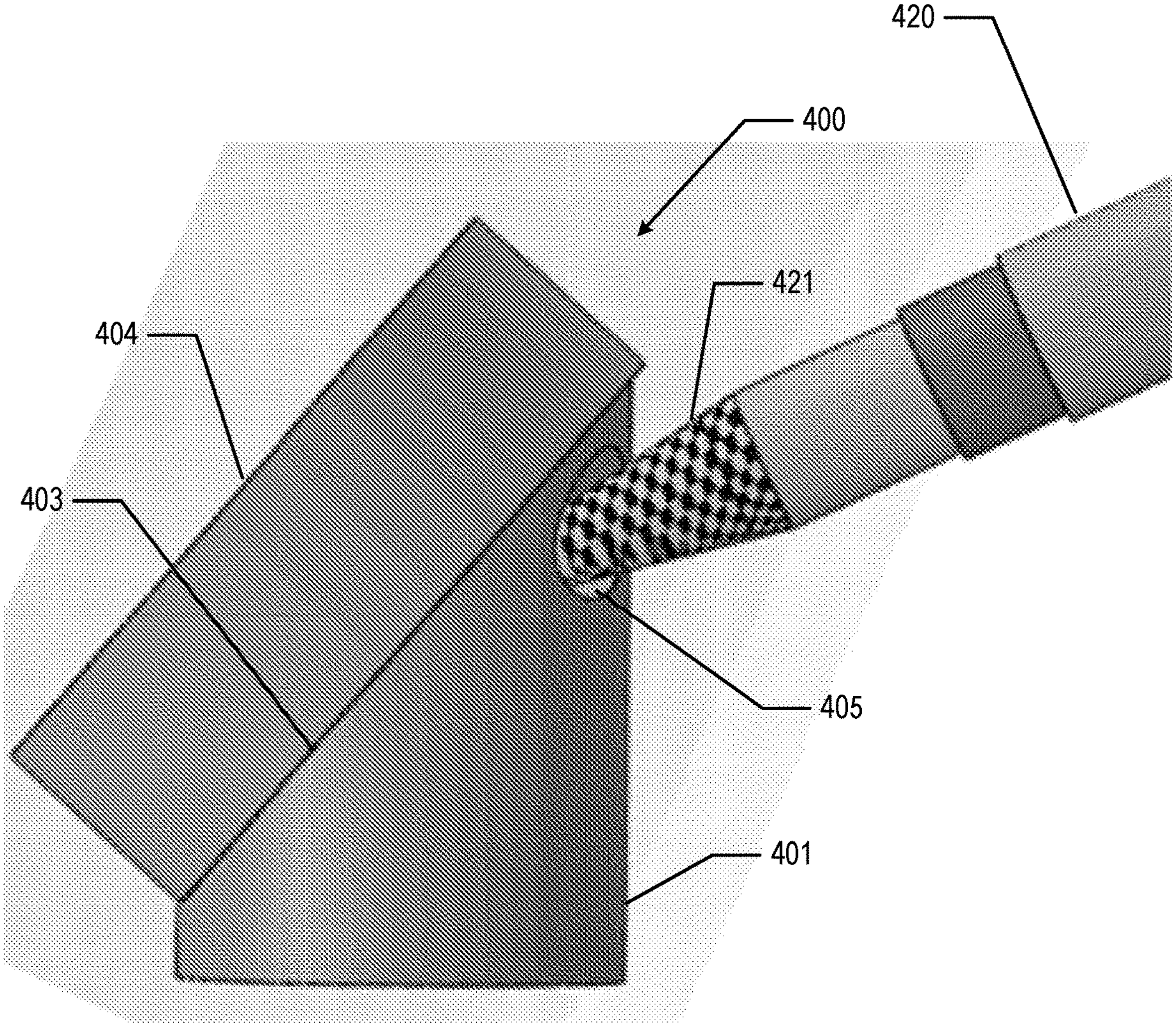
Figure 4D:
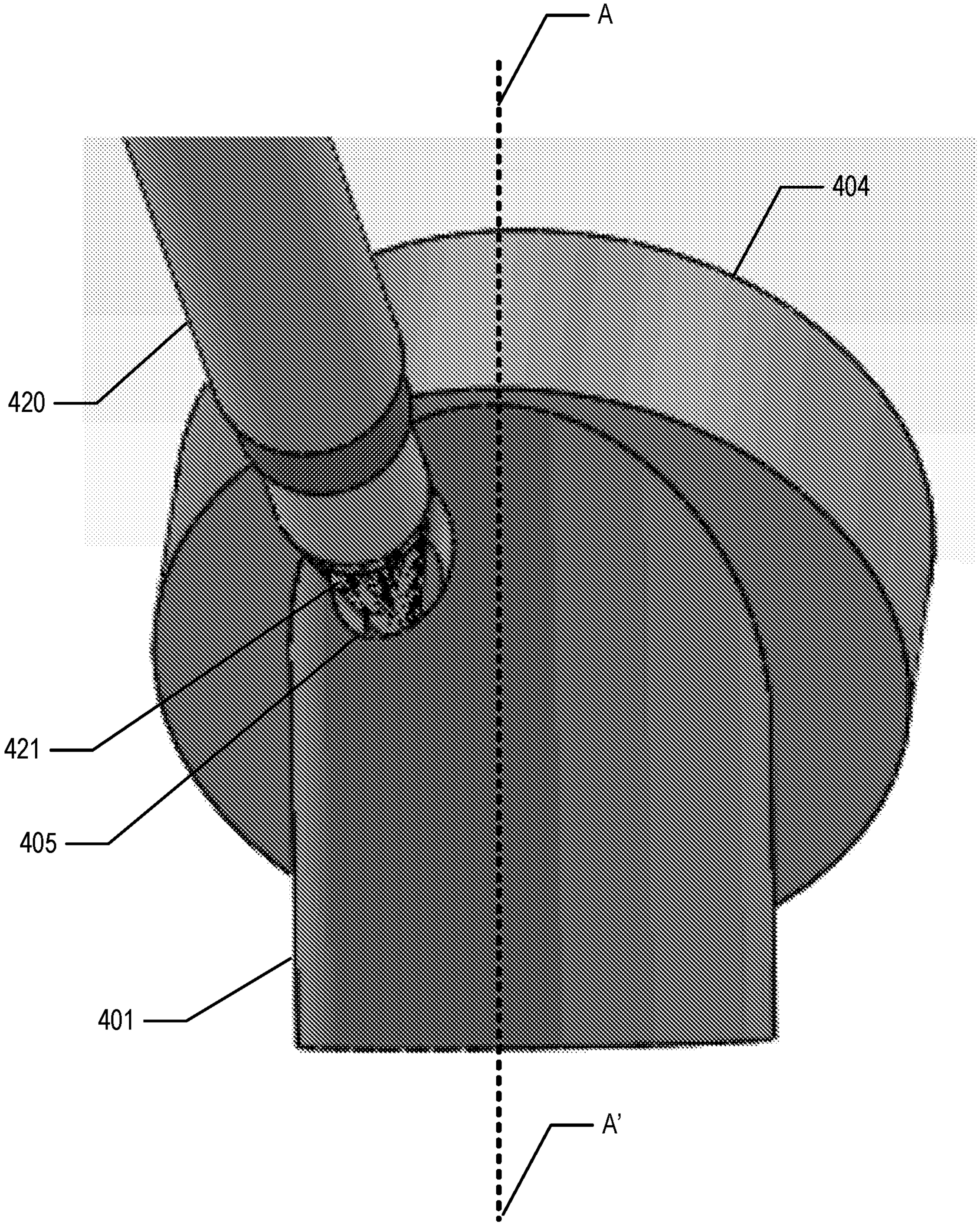

The illumination oven device 400 further includes a side port 405, and FIGS. 4C and 4D particularly show the side port 405 of the illumination oven device 400 receiving an end of the optical fiber 420, or the optical fiber 420 being inserted into the side port 405. As shown, a tapered end 421 of the optical fiber 420 is disposed within the side port 405. In some embodiments, the tapered end 421 is fused to a core (e.g., a silica core) of the optical fiber 420, and as illustrated, the optical fiber 420 can include one or more cladding layers. In some embodiments, the tapered end 421 of the optical fiber 420 is coated in silver, silver nitrate, or other reflective material.

In some embodiments, the side port 405 of the illumination oven device 400 is also tapered, such that the tapered end 421 of the optical fiber 420 tightly fits within the taper of the side port 405. With the side port 405 being closely fitted to the tapered end 421, light that may otherwise leak out through the side port of the illumination oven device 400 is eliminated or reduced.

In some embodiments, the side port 405 is configured to position the optical fiber 420 at a particular downward angle relative to the illumination oven device 400. That is, the side port 405 can be configured such that the longitudinal axis that runs through the center of the optical fiber forms a particular angle with the longitudinal axis that runs through the center of the oven/s cavity. Further details are discussed in connection with FIG. 5A. Thus, when the tapered end 421 is disposed within the side port 405, the side port 405 orients the tapered end 421 at a downward angle. In some embodiments, the downward angle of the side port 405 is different than the tipping angle or inclination angle of the top end 403 (and the mirror 404). For example, the vertical location of the side port, the downward angle of the side port, and/or a slant angle of top end 403 can be selected to allow the light entering the illumination oven device 400 from the tapered end 421 to be incident on the top end 403 (and the mirror 404).

As also illustrated in FIG. 4D, the side port 405 is laterally offset from the plane A-A' that runs through a center of the cylindrical body 401 and passes through the highest point of the top end 403. This lateral offset encourages chaotic trapping of light within the illumination oven device 400 and ultimate absorption of the light by the photoconductive switch. Another view of the illumination oven device 400 is shown in FIG. 4C which demonstrates the side port 405 being located in entirety on one half of the cylindrical body 401. In some other embodiments, at least a center point of the side port 405 is located offset from a center plane (e.g., plane A-A') of the cylindrical body 401, and a width of the side port 405 can span both medial halves of the cylindrical body 401.

Figure 5A:
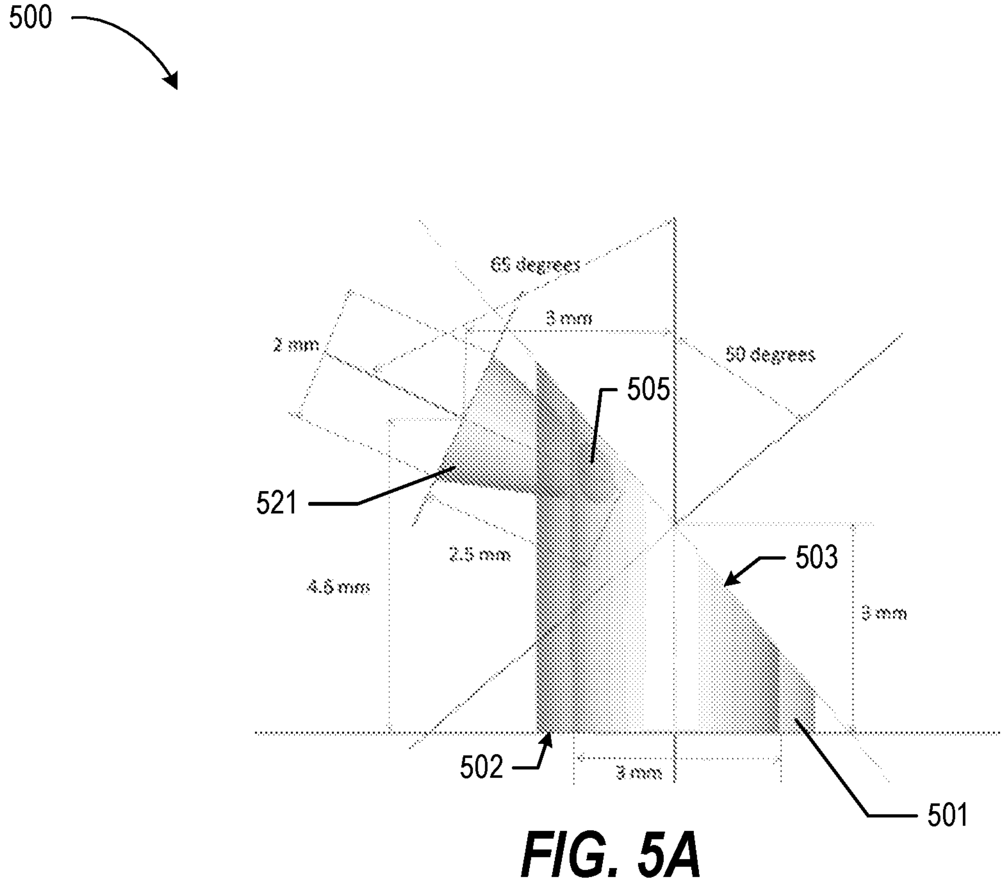
FIGS. 5A-5B illustrate an example configuration of an illumination oven device and a tapered optical waveguide, in accordance with embodiments of the disclosed technology.
Figure 5B:
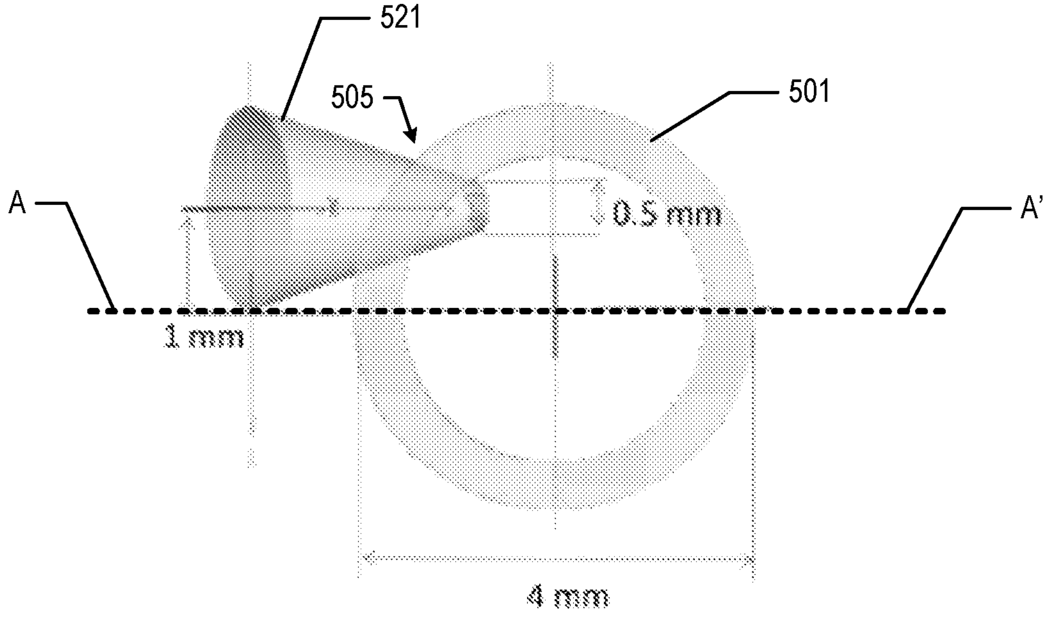

FIGS. 5A-5B illustrate example schematics of an illumination oven device, a tapered end of an optical fiber, and an interface between the illumination oven device and the tapered end of the optical fiber, according to an example implementation. It will be understood that the illustrated configuration in FIGS. 5A-5B are merely illustrative and non-limiting examples, and that various dimensions and angles can be varied.

As shown in FIGS. 5A-B, the illumination oven device 500 includes a cylindrical body 501 that is hollow, defining a cavity within, and as such, the cylindrical body 501 includes an outer diameter and an inner diameter. In the illustrated example, the cylindrical body 501 has an outer diameter of four millimeters and an inner diameter of three millimeters. The sidewall of a hollow cylindrical body of an illumination oven device has a thickness of one millimeter.

In the example configuration of FIG. 5A, a top end 503 of the cylindrical body is tipped, skewed, slanted, and/or angled. In illustrated example, the top end 503 has a tipping/inclination/slant angle of 50 degrees from a longitudinal axis that runs through the center of the cylindrical body 501. As noted earlier, FIG. 5A illustrates one example embodiment. Accordingly, in other embodiments, the top end 503 can have a tipping angle between 30 degrees and 60 degrees, between 35 degrees and 50 degrees, or between 40 degrees and 45 degrees, based on the design characteristics suitable for a particular application or configuration.

As illustrated in FIG. 5A, the side port 505 is angled, or configured to angle an optical fiber received therein, at a downward angle. In particular, in the illustrated configuration of FIG. 5A, the angle between the longitudinal axis that runs through the center of the optical fiber and the longitudinal axis that runs through the center of the illumination oven device 500 is 65 degrees. In some embodiments, the downward angle can be selected to have a value between 90 degrees (perpendicular to the longitudinal axis of the illumination oven device) and the tipping angle of the top end 503. In some embodiments, the downward angle may be larger than 90 degrees. The illustrated example configuration of FIG. 5A has a tapered end 521 of an optical fiber that is 2.5 millimeters and terminates in a face with a diameter of approximately 0.5 millimeters.

In some embodiments, the side port 505 is laterally offset from a plane that passes through the center of the cylindrical body 501 and the highest point of the slanted top end, for example, the plane A-A' indicated in FIG. 5B and FIG. 4D. In some embodiments, the side port 505 is located at an approximate midpoint of a half of the cylindrical body 501 on one side of the aforementioned plane. In the example configuration of FIG. 5B, the side port 505 is positioned at a one-millimeter lateral offset from the aforementioned center plane. In some embodiments, a lateral offset is approximately a fourth of the diameter of the cylindrical body 501, or less than a fourth of the diameter.

Figure 6:
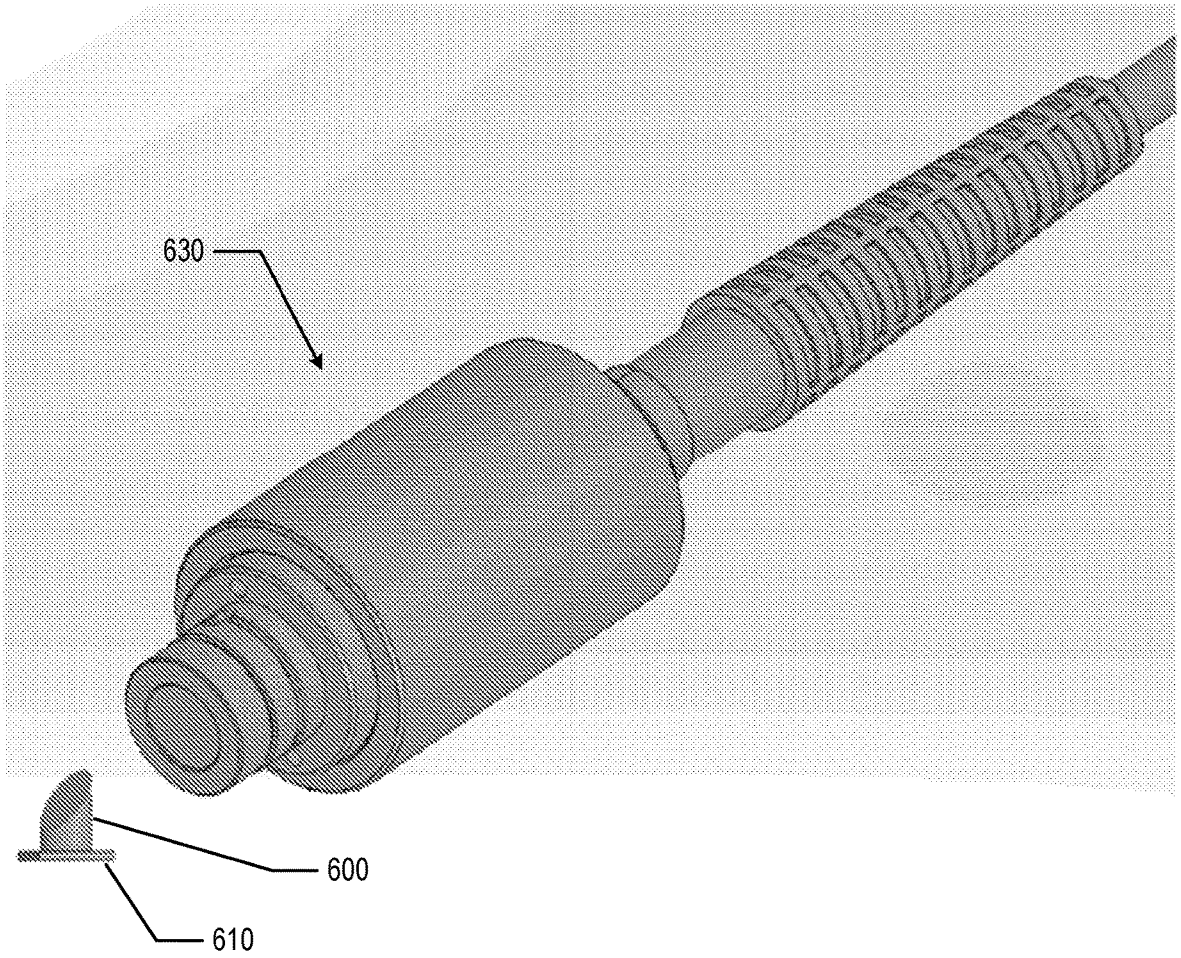
FIG. 6 illustrates an example of an illustration system that includes an illumination oven device that directs light from a light source to a photoconductive device, in accordance with embodiments of the disclosed technology.

FIG. 6 illustrates an example illumination system in which a lens system 630, including one or more lenses or micro lenses, supplies light to an illumination oven device 600 that delivers the light to a photoconductive switch 610 on which the illumination oven device 600 is located. As illustrated, the illumination oven device 600 may be smaller and more compact than the lens system 630, which focuses or converges the light onto a small spot that is launched into the side port of the illumination oven device 600. The configuration of FIG. 6 allows delivery of light to the oven in applications where connections though an optical fiber may not be feasible or possible. In comparison to an optical fiber or waveguide, however, the lens system 630 presents additional surfaces that the light interacts with, and it therefore, may require further design (and optical loss) and alignment considerations.

Figure 7:
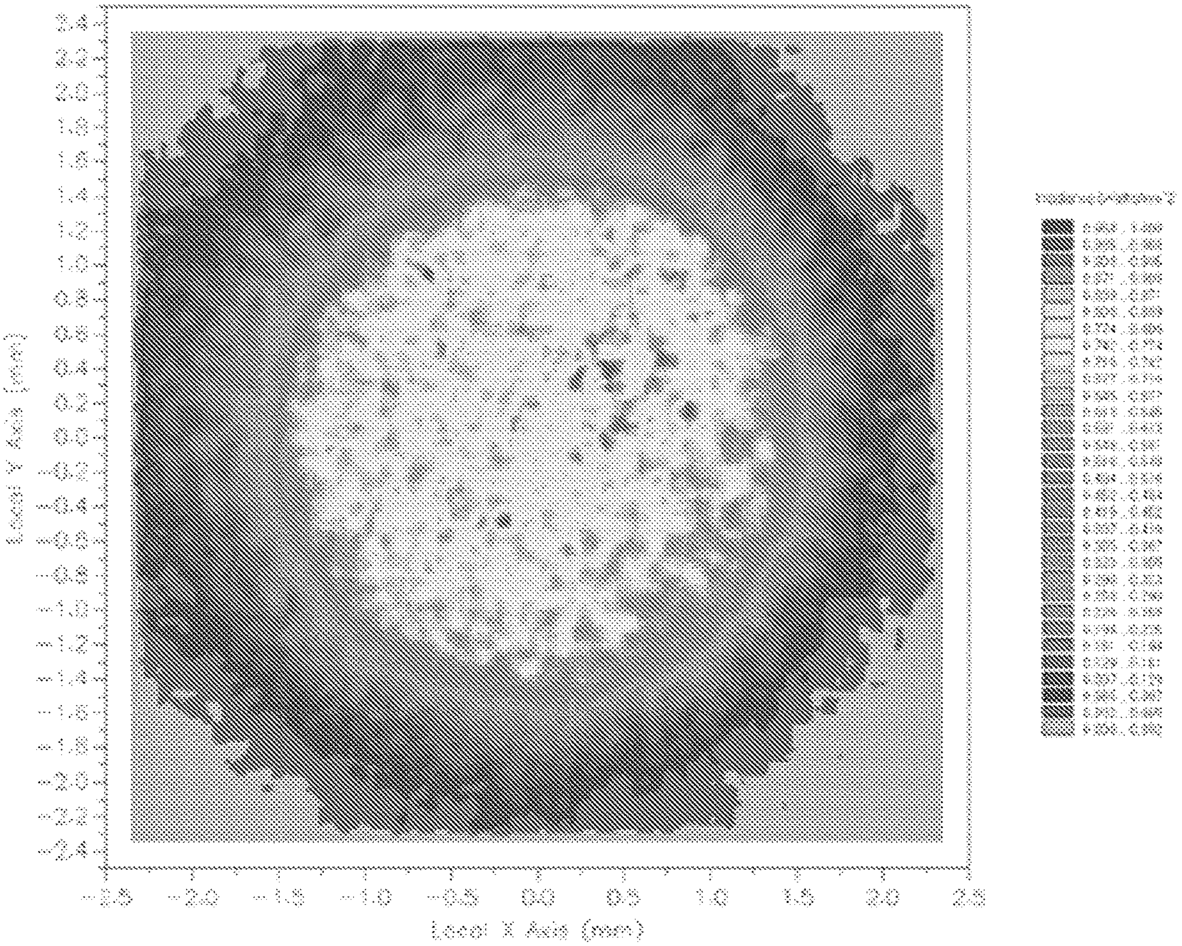
FIG. 7 illustrates an example of light irradiance provided by an illumination oven device, in accordance with embodiments of the disclosed technology.

FIG. 7 provides an example of an illumination or irradiance profile provided by the illumination oven device, for example, on a photoconductive switch, in accordance with an example embodiment. In the illustrated example, the profile indicates irradiance (e.g., measured in Watts/$mm^2$) over a spatial area. In part due to the trapping and scattering of light within the illumination oven device, the illumination oven device is configured to uniformly deliver illumination to the photoconductive switch, as demonstrated in the illustrated profile. In some embodiments, an illumination system includes a multi-modal optical waveguide coupled to the illumination oven device, and various peaks of irradiance throughout in the profile (seen as splotches in the illustrated profile) may be due to the multi-modal nature of the light received by the illumination oven device. In some embodiments, an illumination system includes a single-mode optical waveguide to improve a uniformity of irradiance delivered to a photoconductive switch by the illumination oven device.

The design of the disclosed illumination ovens and illumination systems can be modified and optimized based on several parameters that include: reflectivity of the oven walls, reflectivity of the slanted top surface, diameter of the side port, diameter of the end face of the tapered waveguide, convergence angle of the light that enters the oven through the side port, the downward angle of the side port, the slant angle of the top surface, the height of the side port from the bottom (exit) surface of the oven, the offset of the side port with respect to the center plane of the oven, a taper angle of the tapered waveguide, a taper length of the tapered waveguide, reflectivity of the optical device surface that interfaces with the bottom (exit surface of the oven), material of the oven (especially for an oven that is not hollow), texture of the reflective surfaces of the oven, diameter of the oven, and/or wavelength of the incident light. These and other parameters can be adjusted or designed to produce the desired illumination characteristics that ultimately exits the bottom surface of the twister oven. These and other parameters can also be adjusted or designed to optimize a reduction of electrical resistance of the photoconductive device to which the oven delivers light.

Figure 8:
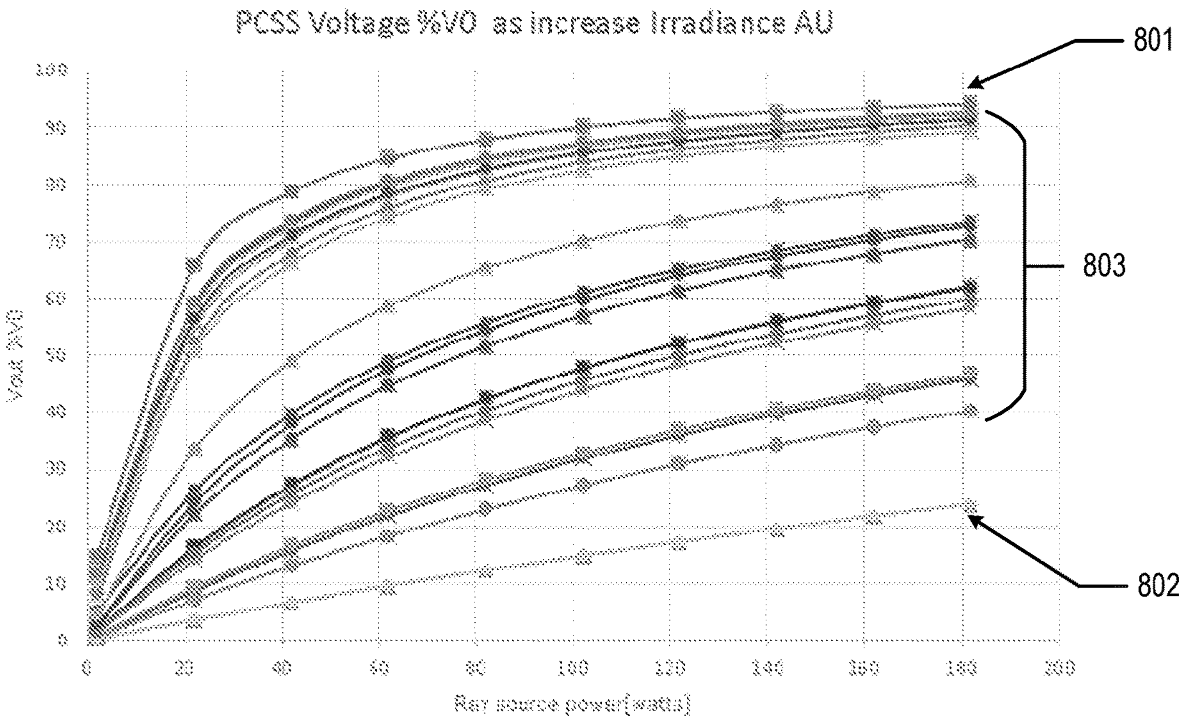
FIG. 8 illustrates an example of efficiency performance with respect to photoconductive switch output provided by an illumination oven device, in accordance with embodiments of the disclosed technology.

FIG. 8 provides example results relating to an efficiency of an illumination oven device in delivering illumination to a particular photoconductive semiconductor switch (PCSS). A particular curve 801 illustrated in FIG. 8 represents a voltage output of a photoconductive switch in response to light of different power being delivered to the photoconductive switch by an illumination oven device in accordance with embodiments described herein. As shown, the particular curve 801 asymptotically plateaus towards higher powers of light provided to an illumination oven device. The bottom curve 802 corresponds to a design starting point, and remaining curves 803 correspond to successive iterations of the design that included modifying one or more of the above noted parameters. The particular curve 801 illustrates the desired switch characteristics that may represent optimum (or desirable) performance.

Figure 9:
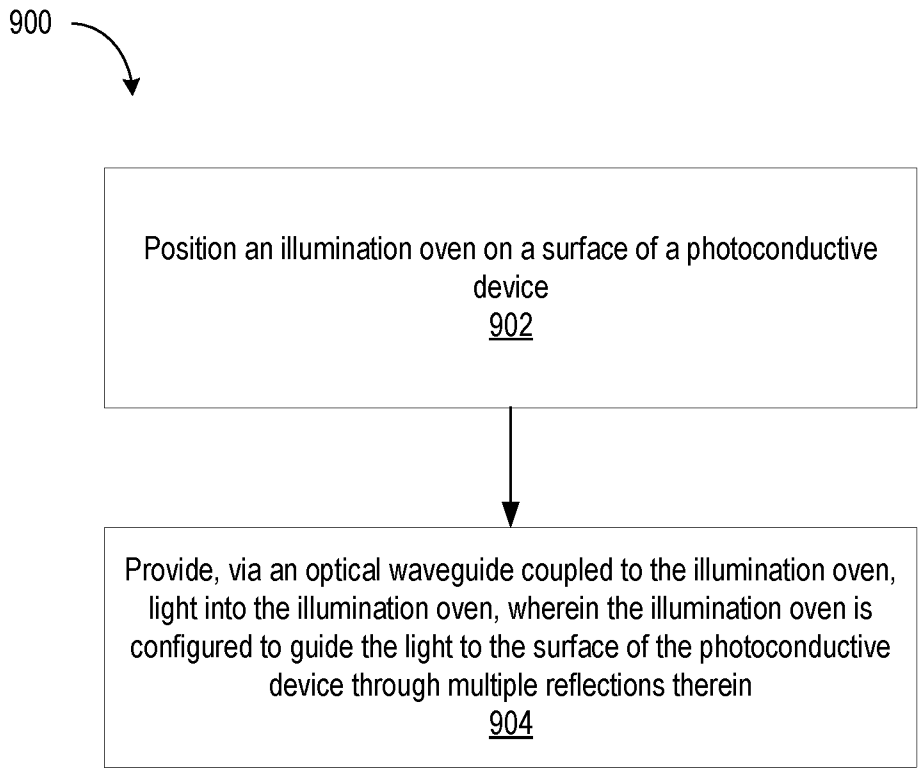
FIG. 9 illustrates a flowchart of an example method of illuminating a photoconductive device.

FIG. 9 is a flowchart of an example method 900 for illuminating a photoconductive device, as described in the example embodiments above. At block 902, the method 900 includes positioning an illumination oven on a surface of the photoconductive device. In some embodiments, the surface of the photoconductive device is a window that allows light to reach photoconductive material of the photoconductive device. In some embodiments, the surface includes the photoconductive material of the photoconductive device. The illumination oven includes a cylindrical body, and at block 902, the cylindrical body is oriented in an upright position such that a bottom end of the cylindrical body interfaces with the surface of the photoconductive device.

At block 904, the method 900 includes providing light into the illumination oven via a port located on a sidewall of the illumination oven. The light is provided from an optical waveguide, and in some embodiments, an end of the optical waveguide is positioned in the port. The illumination oven includes an angled top end (of the cylindrical body) that is configured to receive and reflect the light downwards such that at least a portion of the light is reflected multiple times by internal surfaces of the illumination oven prior to being directed through a bottom end of the illumination oven to the surface of the photoconductive device. The multiple reflections and guidance of the light towards the bottom end of the illumination oven can resemble a descending twister.

In some embodiments, the port is located at a lateral offset from a center plane of the illumination oven that runs through a center of the illumination oven and a highest point of the angled top end of the illumination oven. In some embodiments, the illumination oven is configured to provide the light to the surface uniformly through the interface between the bottom end and the surface of the photoconductive device.

In some embodiments, the method 900 further includes selecting one or more of a location of the port on the illumination oven, an inclination angle of the angled top end of the illumination oven, or a taper angle of the optical waveguide to reduce or minimize an amount of back reflected light in the illumination oven that exits the illumination oven through the port.

In some embodiments, the method 900 further includes coupling a first end of the optical waveguide, such as a tapered end, to the port of the illumination oven. In some embodiments, the method 900 further includes coupling a second end of the optical waveguide, such as a free end, to an illumination source that generates the light (or to another optical waveguide that is coupled to the illumination source).

At block 906, the method 900 includes guiding the light out of a bottom end of the cylindrical illumination oven at which the photoconductive switch is located. For example, the bottom end of the cylindrical illumination oven is interfaced and connected with the photoconductive switch. In some embodiments, the light propagates through the photoconductive material of the switch and reflects off of a lower surface of the photoconductive switch back into the cylindrical illumination oven. Guiding the light includes minimizing a portion of the back-reflected light that travels into the tapered optical waveguide. For example, guiding the light includes allowing less than half of the back-reflected light to reach the side port and/or the tapered optical waveguide. In some embodiments, the minimizing is accomplished based on a tipping angle of the angled top end. In some embodiments, the minimizing is accomplished based on a lateral offset of the side port with respect to a center of the cylindrical illumination oven. In some embodiments, the minimizing is accomplished based on a taper angle of the tapered optical waveguide that causes angular spreading of the light that is received into the cylindrical illumination oven.

Example 1 is an aspect of the disclosed technology, in which an illumination oven device for delivering illumination to a photoconductive device includes a cylindrical body that includes a top end and a bottom end. The bottom end is configured to interface with and deliver light to the photoconductive device. The top end is angled relative to the bottom end. The illumination oven device further includes a port located on a sidewall of the cylindrical body to allow input light from an illumination source to enter the cylindrical body. The port is configured to allow the input light that enters the cylindrical body to be incident on and reflected downward from a surface of the top end. At least a portion of the input light that enters the cylindrical body undergoes multiple reflections from internal surface of the cylindrical body prior to being directed to the photoconductive device through the bottom end.

Example 2 includes the illumination oven device of example 1, wherein the port is configured to receive a tapered optical waveguide for delivery of the input light into the cylindrical body. The port is also configured to fit an end of the tapered optical waveguide at a downward angle such that an angle between a longitudinal axis that runs through a center of the tapered optical waveguide and a longitudinal axis that runs through a center of the cylindrical body is different than 90 degrees.

Example 3 includes the illumination oven device of example 2, further including the tapered optical waveguide, wherein the end of the tapered optical waveguide is fixedly attached to the port.

Example 4 includes the illumination oven device of example 2, wherein the downward angle has a value between 90 degrees and an inclination angle of the top end.

Example 5 includes the illumination oven device of any of examples 1-4, wherein the cylindrical body is hollow and defines a cavity having reflective inner surfaces.

Example 6 includes the illumination oven device of example 5, wherein the light is received into the cylindrical body via an optical fiber having a tapered end that protrudes through the port and into the cavity.

Example 7 includes the illumination oven device of any of examples 1-6, wherein the port is positioned at an offset with respect to a plane that passes through a center of the cylindrical body and a highest point of the top end.

Example 8 includes the illumination oven device of any of examples 1-4 or 7, wherein the cylindrical body is a solid construction having a reflective coating on the sidewall and the surface of the top end, and wherein the cylindrical body is configured to direct at least a portion of the input light that enters the cylindrical body based on reflections thereon.

Example 9 includes the illumination oven device of any of examples 1-8, further including a mirror attached flush against the top end of the cylindrical body to form the surface of the top end that is configured to receive and reflect the input light.

Example 10 includes the illumination oven device of any of examples 1-9, further including a protection coating disposed on an outer surface of the cylindrical body.

Example 11 includes the illumination oven device of example 10, wherein the protection coating is composed of an organic epoxy material.

Example 12 includes the illumination oven device of any of examples 1-11, wherein the top end is angled at an inclination angle in a range from 35 to 50 degrees with respect to the bottom end.

Example 13 includes the illumination oven device of any of examples 1-12, wherein one or more of a location of the port on the sidewall, an inclination angle of the top end, or a downward angle of the input light that enters through the port are configured to reduce or minimize an amount of back reflected light in the cylindrical body that exits the cylindrical body through the port.

Example 14 is another aspect of the disclosed technology, in which an illumination system includes an illumination source configured to generate light, an optical waveguide having a source end coupled to the illumination source and a tapered end at which the light from the illumination source is emitted, a photoconductive device including photoconductive material and configured to provide an output in response to the photoconductive material receiving incident light, and a cylindrical oven. The cylindrical oven is configured to deliver the light emitted at the tapered end of the optical waveguide to the photoconductive material of the photoconductive device. The cylindrical oven includes a bottom end interfaced with the photoconductive material of the photoconductive device, and a top end having an inclination angle with respect to the bottom end. The cylindrical oven further includes a port located on a sidewall of the cylindrical oven to allow the light emitted at the tapered end of the optical waveguide to enter the cylindrical oven to be incident on and reflected downward from a surface of the top end. At least a portion of the light that enters the cylindrical oven undergoes multiple reflections from internal surfaces of the cylindrical oven prior to being directed to the photoconductive material through the bottom end.

Example 15 includes the illumination system of example 14, wherein the cylindrical oven further includes a mirror located on the top end to form the surface of the top end that is configured to receive and reflect the light.

Example 16 includes the illumination system of any of examples 14-15, wherein the port of the cylindrical oven is configured to position the tapered end such that a longitudinal axis that runs through a center of the tapered end is at a downward angle with respect to a longitudinal axis that runs through a center of the cylindrical oven. The downward angle is between 90 degrees and the inclination angle of the top end Example 17 includes the illumination system of any of examples 14-16, further including a protection coating continuously disposed along an outer surface of the cylindrical oven and at least the tapered end of the optical waveguide. The tapered end of the optical waveguide is secured within the port of the cylindrical oven at least in part due to the protection coating.

Example 18 includes the illumination system of any of examples 14-17, wherein one or more of (i) a location of the port on the sidewall of the cylindrical oven, (ii) the inclination angle of the top end of the cylindrical oven, (iii) a downward angle of the optical waveguide at the port, or (iv) a taper angle of the tapered end of the optical waveguide are configured to reduce or minimize an amount of back reflected light in the cylindrical oven that exits the cylindrical oven through the port.

While this document includes many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this disclosure.

What is claimed is:

1. An illumination oven device for delivering illumination to a photoconductive device, comprising:

a cylindrical body that includes a top end and a bottom end, the bottom end configured to interface with and deliver light to the photoconductive device, wherein the top end is angled relative to the bottom end; and a port located on a sidewall of the cylindrical body to allow input light from an illumination source to enter the cylindrical body, wherein the port is configured to allow the input light that enters the cylindrical body to be incident on and reflected downward from a surface of the top end, wherein at least a portion of the input light that enters the cylindrical body undergoes multiple reflections from internal surfaces of the cylindrical body prior to being directed to the photoconductive device through the bottom end, wherein the cylindrical body is configured to receive the input light via an optical waveguide having a tapered end that protrudes through the port and into the cylindrical body.

2. The illumination oven device of claim 1, wherein the port is configured to fit the tapered end of the optical waveguide at a downward angle such that an angle between a longitudinal axis that runs through a center of the optical waveguide and a longitudinal axis that runs through a center of the cylindrical body is different than 90 degrees.

3. The illumination oven device of claim 1, further comprising the optical waveguide, wherein the tapered end of the optical waveguide is fixedly attached to the port.

4. The illumination oven device of claim 2, wherein the downward angle has a value between 90 degrees and an inclination angle of the top end.

5. The illumination oven device of claim 1, wherein the cylindrical body is hollow and defines a cavity having reflective inner surfaces.

6. The illumination oven device of claim 1, wherein the port is positioned at an offset with respect to a plane that passes through a center of the cylindrical body and a highest point of the top end.

7. The illumination oven device of claim 1, wherein the cylindrical body is a solid construction having a reflective coating on the sidewall and the surface of the top end, and wherein the cylindrical body is configured to direct at least a portion of the input light that enters the cylindrical body based on reflections thereon.

8. The illumination oven device of claim 1, further comprising:

a mirror attached flush against the top end of the cylindrical body to form the surface of the top end that is configured to receive and reflect the input light.

9. The illumination oven device of claim 1, further comprising a protection coating disposed on an outer surface of the cylindrical body.

10. The illumination oven device of claim 9, wherein the protection coating is composed of an organic epoxy material.

11. The illumination oven device of claim 1, wherein the top end is angled at an inclination angle in a range from 35 to 50 degrees with respect to the bottom end.

12. The illumination oven device of claim 1, wherein one or more of a location of the port on the sidewall, an inclination angle of the top end, or a downward angle of the input light that enters through the port are configured to reduce or minimize an amount of back reflected light in the cylindrical body that exits the cylindrical body through the port.

13. An illumination system for a photoconductive device, comprising:

an illumination source configured to generate light;

an optical waveguide having a source end coupled to the illumination source and a tapered end at which the light from the illumination source is emitted;

a photoconductive device including photoconductive material and configured to provide an output in response to the photoconductive material receiving incident light; and a cylindrical oven configured to deliver the light emitted at the tapered end of the optical waveguide to the photoconductive material of the photoconductive device, the cylindrical oven including:

a bottom end interfaced with the photoconductive material of the photoconductive device, a top end having an inclination angle with respect to the bottom end, and a port located on a sidewall of the cylindrical oven to allow the light emitted at the tapered end of the optical waveguide to enter the cylindrical oven to be incident on and reflected downward from a surface of the top end, wherein at least a portion of the light that enters the cylindrical oven undergoes multiple reflections from internal surfaces of the cylindrical oven prior to being directed to the photoconductive material through the bottom end.

14. The illumination system of claim 13, wherein the cylindrical oven further includes a mirror located on the top end to form the surface of the top end that is configured to receive and reflect the light.

15. The illumination system of claim 13, wherein the port of the cylindrical oven is configured to position the tapered end such that a longitudinal axis that runs through a center of the tapered end is at a downward angle with respect to a longitudinal axis that runs through a center of the cylindrical oven, wherein the downward angle is between 90 degrees and the inclination angle of the top end.

16. The illumination system of claim 13, further comprising a protection coating continuously disposed along an outer surface of the cylindrical oven and at least the tapered end of the optical waveguide, wherein the tapered end of the optical waveguide is secured within the port of the cylindrical oven at least in part due to the protection coating.

17. The illumination system of claim 13, wherein one or more of (i) a location of the port on the sidewall of the cylindrical oven, (ii) the inclination angle of the top end of the cylindrical oven, (iii) a downward angle of the optical waveguide at the port, or (iv) a taper angle of the tapered end of the optical waveguide are configured to reduce or minimize an amount of back reflected light in the cylindrical oven that exits the cylindrical oven through the port.

18. A method for illuminating a photoconductive device, comprising:

positioning an illumination oven on a surface of the photoconductive device; and providing, from an optical waveguide, light into the illumination oven via a port located on a sidewall of the illumination oven, wherein the illumination oven includes an angled top end configured to receive and reflect the light downwards such that at least a portion of the light is reflected multiple times by internal surfaces of the illumination oven prior to being directed through a bottom end of the illumination oven to the surface of the photoconductive device, wherein the illumination oven is configured to receive the light from a tapered end of the optical waveguide that protrudes through the port and into the illumination oven.

19. The method of claim 18, wherein the light provided via the optical waveguide enters the illumination oven via a side port located at a lateral offset from a center plane of the illumination oven.

20. The method of claim 18, further comprising:

selecting one or more of a location of the port on the illumination oven, an inclination angle of the angled top end of the illumination oven, or a taper angle of the optical waveguide to reduce or minimize an amount of back reflected light in the illumination oven that exits the illumination oven through the port.

21. The method of claim 18, further comprising:

coupling a tapered end of the optical waveguide to the illumination oven; and coupling a free end of the optical waveguide to an illumination source that generates the light.

22. The method of claim 18, wherein the illumination oven is configured to provide the light to the surface uniformly throughout an interface between the bottom end and the surface.

* * * * *